United States Patent
Sugiura et al.

(10) Patent No.: US 9,232,171 B2
(45) Date of Patent: Jan. 5, 2016

(54) ELECTRONIC APPARATUS WITH COOLING UNIT

(71) Applicant: Kabushiki Kaisha Toshiba, Tokyo (JP)

(72) Inventors: Yuusuke Sugiura, Ome (JP); Akifumi Yamaguchi, Kunitachi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 13/793,060

(22) Filed: Mar. 11, 2013

(65) Prior Publication Data

US 2013/0314619 A1  Nov. 28, 2013

(30) Foreign Application Priority Data

May 25, 2012 (JP) .................................. 2012-119773

(51) Int. Cl.
*H04N 5/64* (2006.01)
*H05K 7/20* (2006.01)
*G06F 1/20* (2006.01)
*G06F 1/16* (2006.01)

(52) U.S. Cl.
CPC .. *H04N 5/64* (2013.01); *G06F 1/16* (2013.01); *G06F 1/20* (2013.01); *G06F 1/203* (2013.01); *H05K 7/20136* (2013.01); *H05K 7/20972* (2013.01); *G06F 2200/1631* (2013.01)

(58) Field of Classification Search
CPC ....................................................... H04N 5/64
USPC ....................................................... 348/836
See application file for complete search history.

(56) References Cited

U.S. PATENT DOCUMENTS

| | | | |
|---|---|---|---|
| 7,649,736 B2 * | 1/2010 | Hongo | 361/679.47 |
| 7,830,660 B2 * | 11/2010 | Kang et al. | 361/695 |
| 2005/0207124 A1 * | 9/2005 | Ohnishi et al. | 361/719 |

FOREIGN PATENT DOCUMENTS

| | | |
|---|---|---|
| JP | 2010-061289 A | 3/2010 |
| JP | 2011-003204 A | 1/2011 |

\* cited by examiner

*Primary Examiner* — Dave Czekaj
*Assistant Examiner* — Leron Beck
(74) *Attorney, Agent, or Firm* — Knobbe, Martens, Olson & Bear, LLP

(57) ABSTRACT

An electronic apparatus according to an embodiment includes a housing, a printed circuit board which includes a first surface provided with a heat-generating component and is contained inside the housing, and a fan unit which includes a case and a fan that is rotatably contained in the case. The case includes an exhaust part which includes a part that overlaps the first surface of the printed circuit board and projects toward the heat-generating component, and an air intake part.

12 Claims, 10 Drawing Sheets

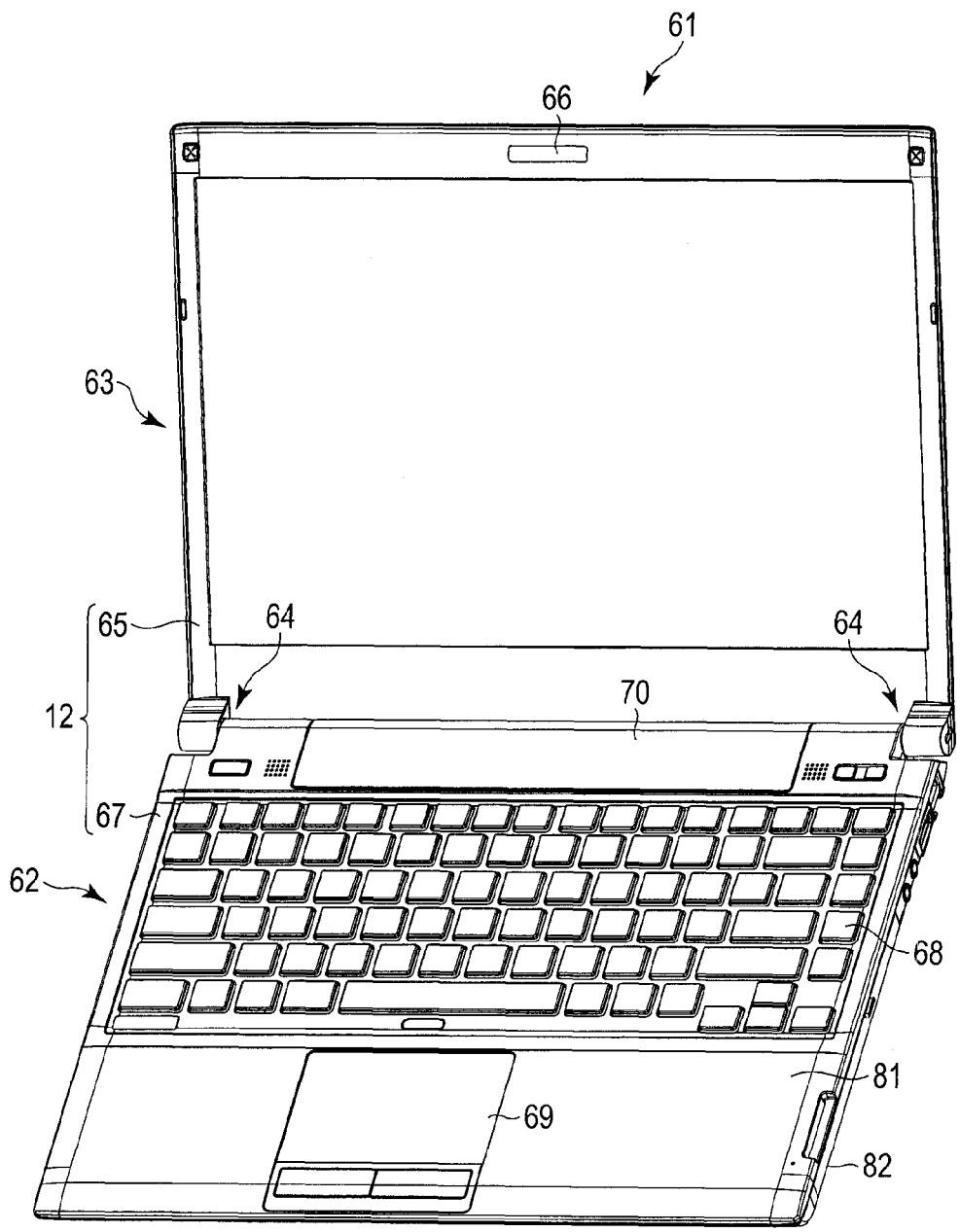
F I G. 4

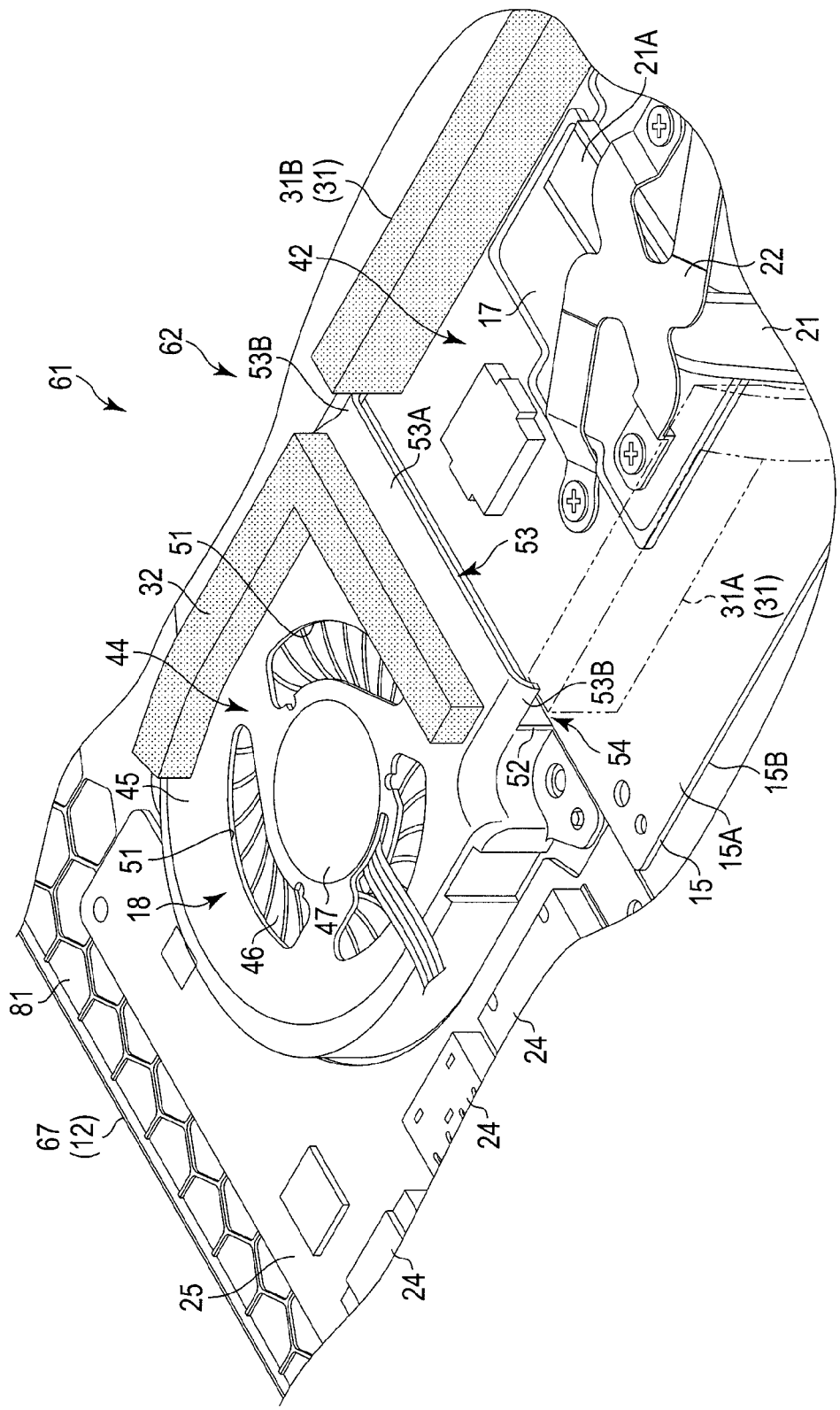
F I G. 10

ELECTRONIC APPARATUS WITH COOLING UNIT

CROSS-REFERENCE TO RELATED APPLICATIONS

This application is based upon and claims the benefit of priority from Japanese Patent Application No. 2012-119773, filed May 25, 2012, the entire contents of which are incorporated herein by reference.

FIELD

Embodiments described herein relate generally to a television and an electronic apparatus, which include a cooling unit.

BACKGROUND

For example, among notebook personal computers, there are notebook personal computers which include a cooling fan.

In such electronic apparatuses, it is required to improve the cooling performance for cooling electronic components which generate heat.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4 is an exemplary perspective view of a portable computer which is an example of an electronic apparatus according to a second embodiment.

FIG. 10 is an exemplary enlarged perspective view of a part, which includes a fan unit, of a portable computer which is an example of an electronic apparatus according to a third embodiment.

DETAILED DESCRIPTION

Various embodiments will be described hereinafter with reference to the accompanying drawings.

In general, an electronic apparatus according to an embodiment includes a housing, a printed circuit board which includes a first surface provided with a heat-generating component and is contained inside the housing, and a fan unit which includes a case and a fan that is rotatably contained in the case. The case includes an exhaust part which includes a part that overlaps the first surface of the printed circuit board and projects toward the heat-generating component, and an air intake part.

A first embodiment of an electronic apparatus will be explained hereinafter with reference to FIG. 1 to FIG. 3. A television 11 which is an example of the electronic apparatus according to the first embodiment is a display apparatus (an electronic apparatus, a television, a television set, a broadcasting wave receiver, a receiver, a receiver of television, an image display device, a device, an apparatus including a display panel). The television 11 of the first embodiment has a structure which is similar to that of a portable computer of a second embodiment, and thus the structure thereof is schematically explained herein. The details of the structure of the electronic apparatus will be explained in the second embodiment, and drawings of the second embodiment will be referred to if necessary.

Figure 1:
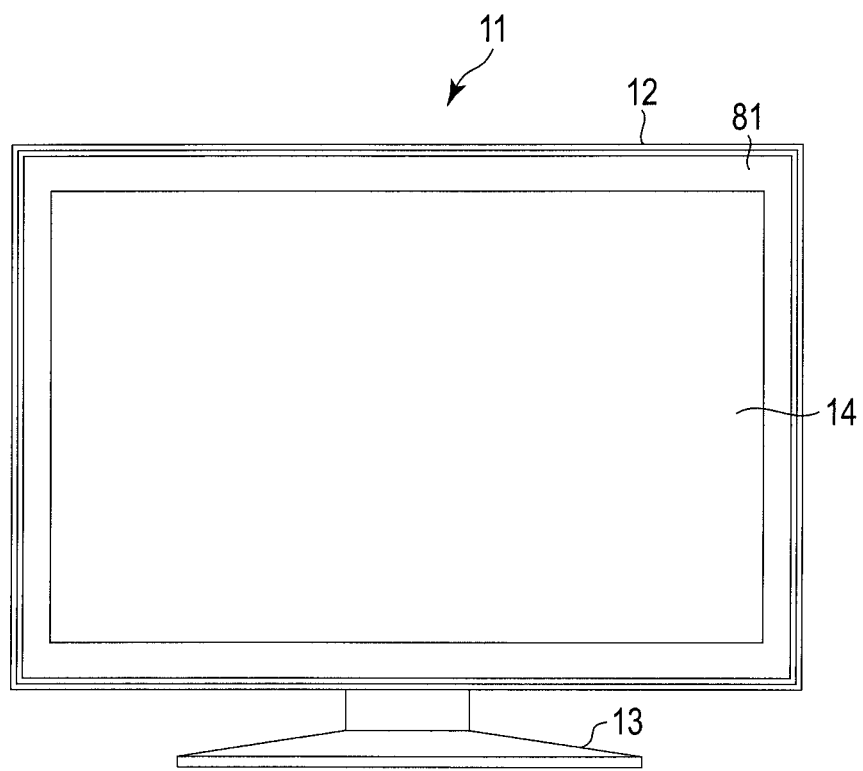
FIG. 1 is an exemplary front view of a television which is an example of an electronic apparatus according to a first embodiment.

As illustrated in FIG. 1, the television 11 comprises a housing 12 having a box shape, and a leg part 13 (stand, support part) which supports the housing 12.

Figure 2:
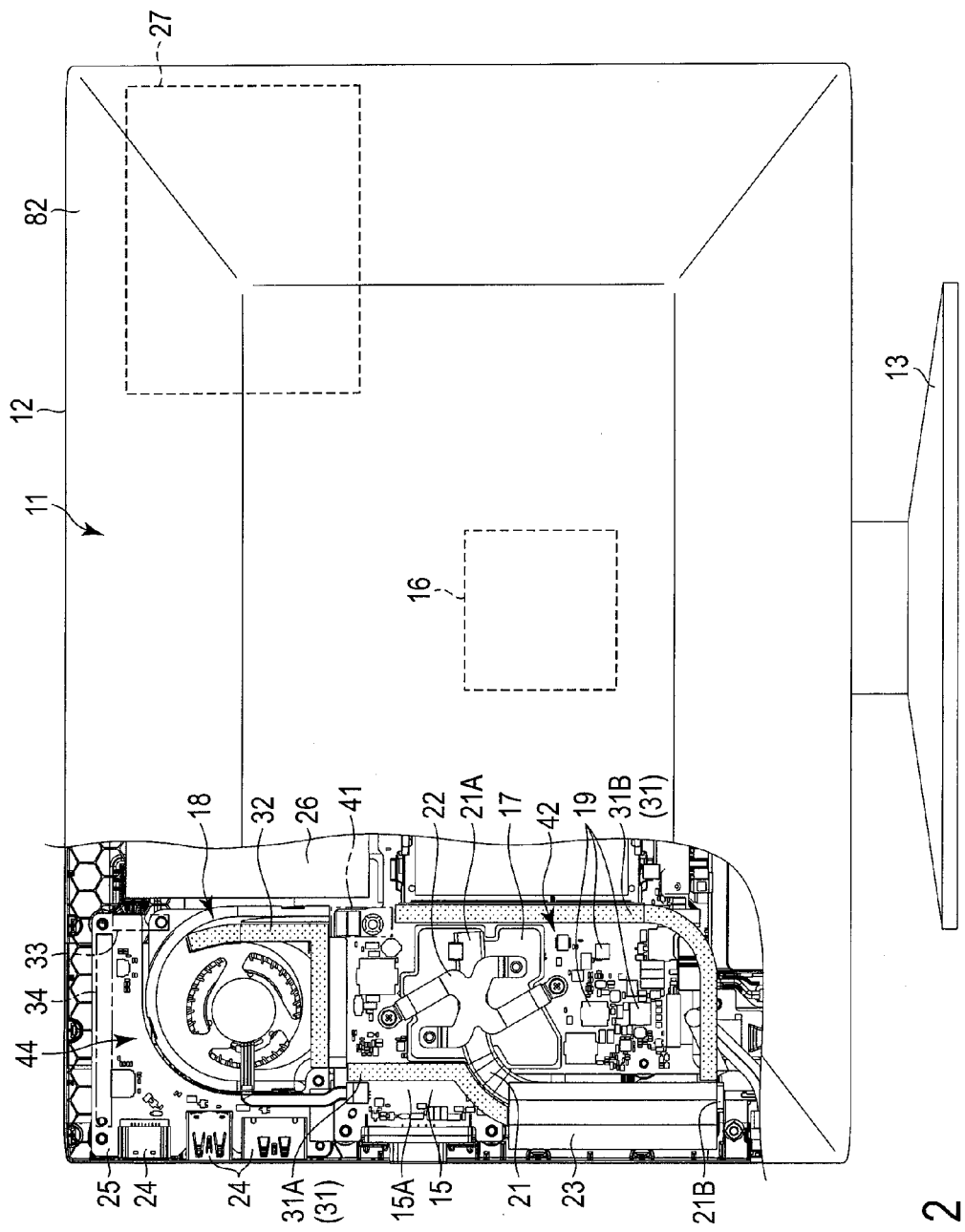
FIG. 2 is an exemplary back view of the television illustrated in FIG. 1, which is in a state where a second case is detached.
Figure 7:
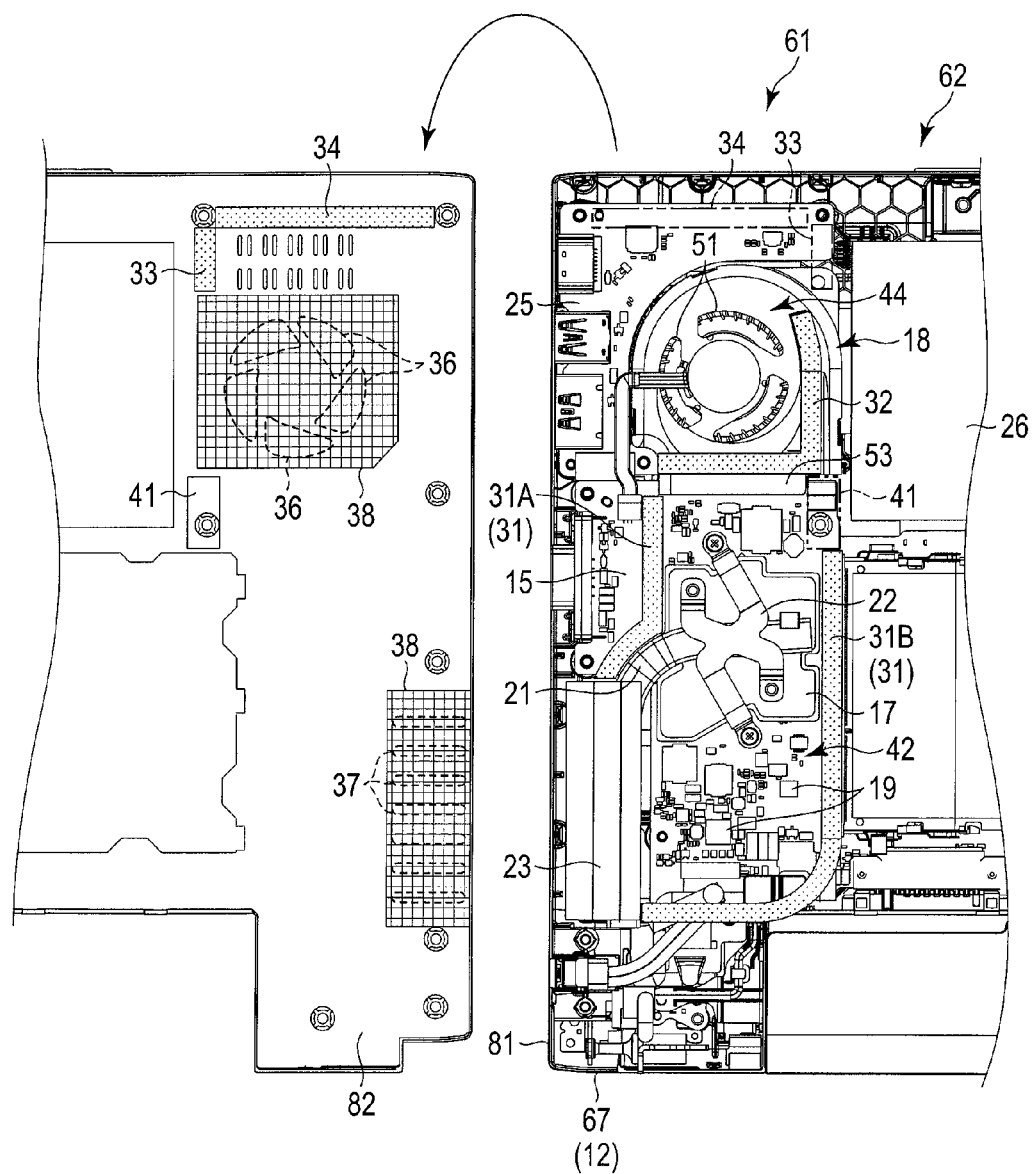
FIG. 7 is an exemplary plan view of the portable computer illustrated in FIG. 4, which is in a state where the second case is detached from the main body part to illustrate the inside of the main body part, and the detached second case with the inside located upward is placed beside the main body part.
Figure 8:
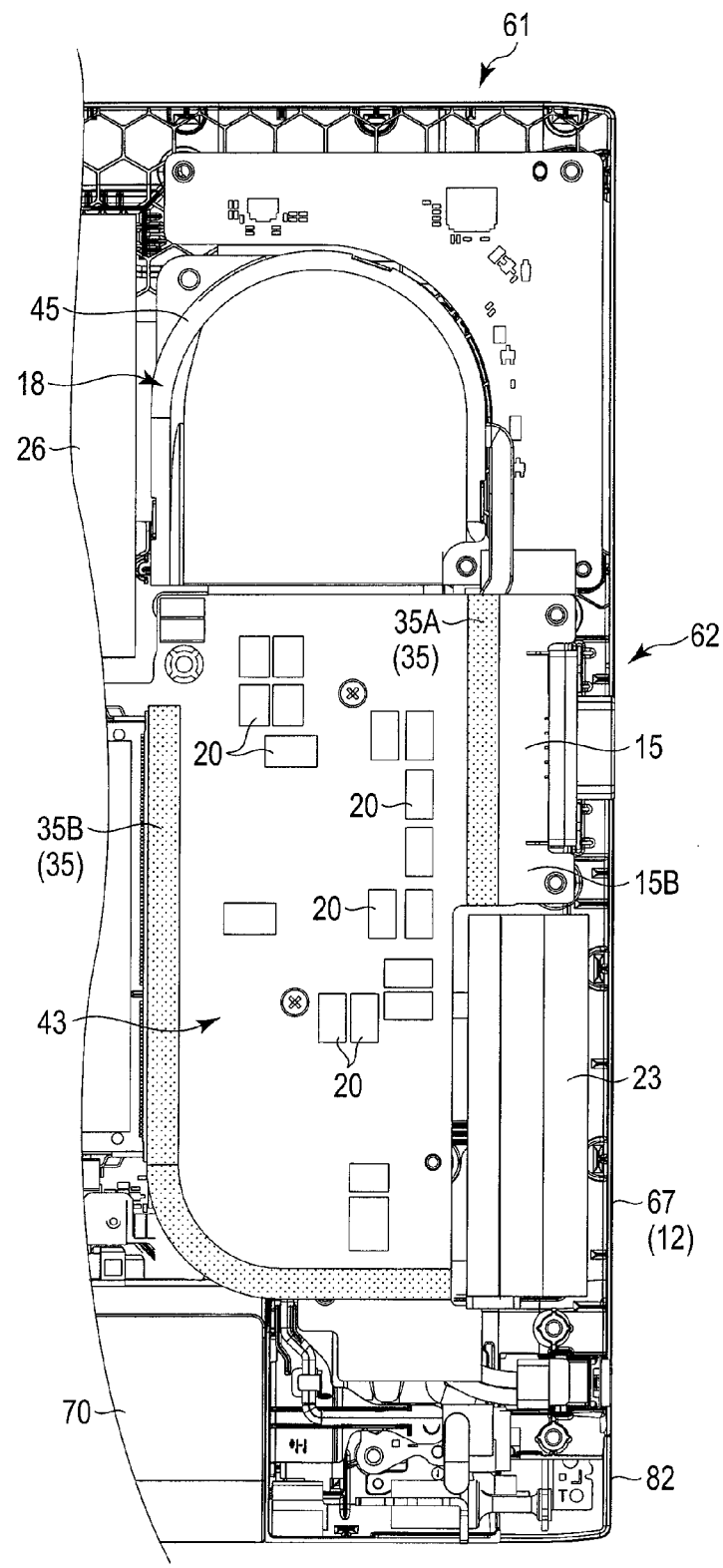
FIG. 8 is an exemplary plan view of the portable computer illustrated in FIG. 4, illustrating the inside of the main body part from a second surface side of a main substrate.
Figure 9:
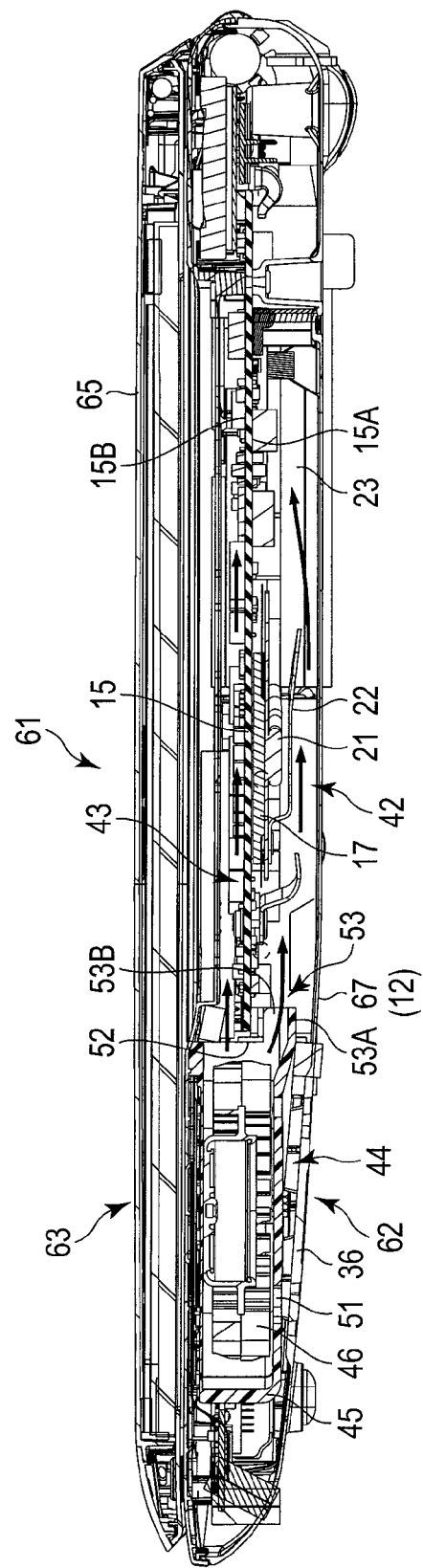
FIG. 9 is an exemplary cross-sectional view of the portable computer illustrated in FIG. 5, taken along line F9-F9 of FIG. 5.

As illustrated in FIG. 1 and FIG. 2, the television 11 includes, inside the housing 12, a display panel 14 which has a flat plate (sheet-like, having flat surfaces) shape and includes one surface that serves as a display screen and displays images and the other surface that is opposed to the one surface, a main substrate 15 (printed circuit board, printed board, controller) which controls modules of the television 11, a tuner module 16 which is provided in a part of the main substrate 15, a circuit component 17 (heat-generating component, CPU) which is provided on a first surface 15A of the main substrate 15, a fan unit 18 configured to cool the circuit component 17 and the like, a heat pipe 21 which is thermally connected at one end part 21A to the circuit component 17 and conveys heat from the circuit component 17, a holder 22 (fixing tool) 22 configured to fix the heat pipe 21 to the circuit component 17, a fin unit 23 which is provided at the other end part 21B of the heat pipe 21 and includes a plurality of heat-radiating fins, power supply circuit components 19 (heat-generating component) which are provided on the main substrate 15, a connector substrate 25 (printed circuit board) which is provided with a connector 24 for external connection, a hard disk drive 26, an optical disk drive 27, a speaker, and first to fifth partition members 31 to 35 (see FIG. 7 and FIG. 8). The main substrate 15 is electrically connected to each of the connector substrate 25, the hard disk drive 26, the optical disk drive 27, and the speaker, through cables or flexible cables.

The display panel 14 is formed of, for example, a liquid crystal display panel which has a rectangular plate shape. The display panel 14 may be a display panel of another type, such as a plasma display panel, an organic EL, a plastic display panel, and a sheet display panel.

The housing 12 includes an air-intake opening part 36 configured to take the external air into the housing, and a discharge part 37 (discharge hole) configured to discharge the air which has been heated by the circuit component 17 (heat-generating component) to the outside of the housing 12 (see FIG. 7). The housing 12 includes a first case 81 which covers the front of the display panel 14, and a second case 82 which covers the rear of the display panel 14. The housing 12 includes a mesh part 38 (see FIG. 7) which is adhered to the internal surface of the housing 12 to cover the opening part 36. The mesh part 38 prevents dust or the like from entering the inside of the housing 12 when the air is taken into the housing 12.

As illustrated in FIG. 2 and the like, the television 11 includes a partition part 41 which is formed as one unitary piece with the housing 12, a first ventilation space 42 which is located between the housing 12 and the first surface 15A and communicates with an exhaust part 52 and the discharge part 37, a second ventilation space 43 (see FIG. 8) which is located between the housing 12 and the second surface 15B and communicates with the exhaust part 52 and the discharge part 37, and an air intake space 44 which communicates with the opening part 36 and an air intake part 51.

As illustrated in FIG. 2, the main substrate 15 includes the first surface 15A which is provided with the first circuit component 17 (heat-generating component, CPU), and the second surface 15B (see FIG. 8) which is provided with a plurality of second circuit components 20 (second heat-generating component), which are smaller than the first circuit component 17, and is opposed to the first surface 15A.

Figure 3:
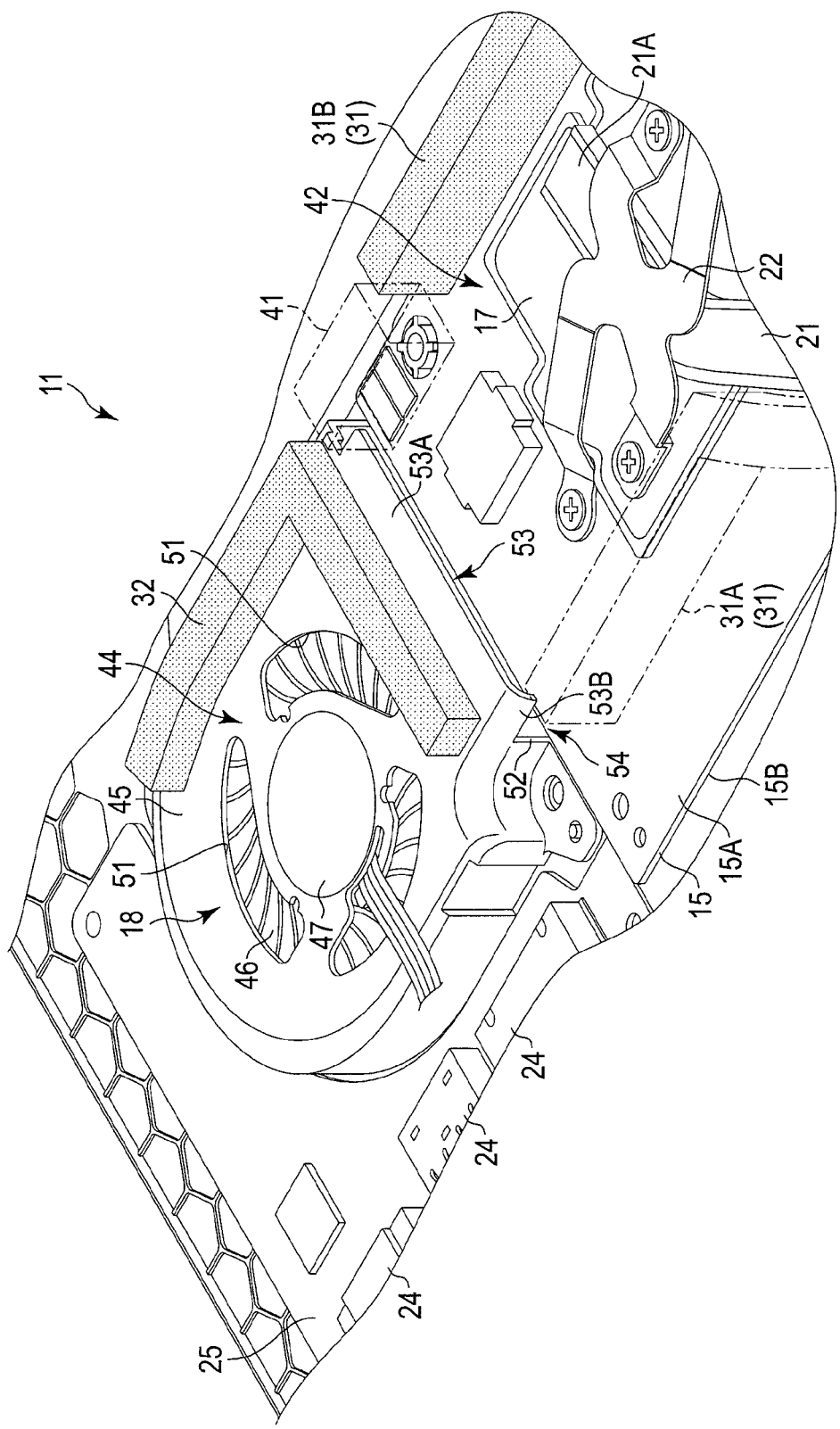
FIG. 3 is an exemplary enlarged perspective view of a part of the television illustrated in FIG. 2, which includes a fan unit.

As illustrated in FIG. 3, the fan unit 18 includes a case 45 (fan case) which has an almost box shape, a fan 46 which is rotatably contained in the case 45, and a motor 47 which rotates the fan 46. The case 45 includes the air intake part 51 for air intake, and the exhaust part 52 which exhausts the air which is fanned by the fan 46.

As illustrated in FIG. 3, the exhaust part 52 includes a projecting part 53 which projects toward the circuit component 17 (heat-generating component). The projecting part 53 which projects toward the circuit component 17 includes a first wall part 53A which overlaps the first surface 15A of the main substrate 15 (printed circuit board) and extends toward the circuit component 17 along the main substrate 15, and a second wall part 53B which extends from one end part (one end part in a direction perpendicular to a direction approaching the circuit component 17 (heat-generating component) from the fan 46) of the first wall part 53A toward the main substrate 15 (printed circuit board). In the present embodiment, the second wall part 53B is formed on only one end part of the first wall part 53A. The second wall part 53B is provided to connect with the first partition members 31, in the state where the fan unit 18 is attached to the housing 12. Although a space 54 (clearance), which is determined in consideration of various tolerances (such as a tolerance of the main substrate 15, tolerance of the fan unit 18, and tolerance of the housing 12), is provided between the end part of the second wall part 53B and the main substrate 15, the end part of the second wall part 53B is located in the vicinity of the main substrate 15.

As illustrated in FIG. 2 and FIG. 3, the partition part 41 is disposed in the vicinity of the other end part, which is located opposite to the one end part of the first wall part 53A, of the first wall part 53A, such that the air current from the fan 46 is guided by the partition part 41 to the discharge part 37. Specifically, in the present embodiment, the first surface 15A of the main substrate 15, the first wall part 53A, the second wall part 53B, and the partition part 41 form a pipe-like (or duct-like) structure to guide the air current from the fan 46 toward the circuit component 17.

A plurality of first partition members 31 are attached to the first surface 15A of the main substrate 15. The main substrate 15 is provided with a space to set up the first partition members 31, and the circuit component 17 and the power supply circuit components 19 are mounted to positions which are displaced from the space. As illustrated in FIG. 2, the first partition members 31 include a first part 31A which has a smaller length, and a second part 31B which has a larger length. The first circuit component 17 and the power supply circuit components 19 are provided in positions which are between the first part 31A and the second part 31B. Each of the first partition members 31 is formed of a sponge which has a bar shape and a square cross section.

As illustrated in FIG. 2, the first ventilation space 42 is provided in a position which is between the first part 31A and the second part 31B. The perimeter of the first ventilation space 42 is defined by the first part 31A, the second part 31B, the partition part 41, the first surface 15A of the main substrate 15, and the internal surface of the housing 12. In other words, the first circuit component 17 and the power supply circuit components 19 are arranged in the first ventilation space 42.

As illustrated in FIG. 3, the second partition member 32 is attached to the case 45, which will be explained later, of the fan unit 18. The second partition member 32 is formed of a sponge which has a bar shape and a square cross section. The second partition member 32 has an almost "L" shape, and is provided in the vicinity of the air intake part 51 of the case 45 to surround the air intake part 51.

The third partition member 33 is attached to the second case 82 of the housing 12, and abuts against the case 45 of the fan unit 18 and the connector substrate 25 in a state where the television 11 is assembled (see FIG. 7). The third partition member 33 is formed of a sponge which has a bar shape and a square cross section. The third partition member 33 is provided in the vicinity of the opening part 36 to surround the opening part 36.

The fourth partition member 34 is attached to the second case 82 of the housing 12, and abuts against the connector substrate 25 in a state where the television 11 is assembled (see FIG. 7). The fourth partition member 34 is formed of a sponge which has a bar shape and a square cross section. The fourth partition member 34 is provided in the vicinity of the opening part 36 to surround the opening part 36. The connector substrate 25 is provided with a space against which the fourth partition member 34 abuts, and the connector 24 is mounted to a position which is displaced from the space. The air intake space 44 is provided in a position which is surrounded by the second to fourth partition members 32 to 34 that form an almost "U" shape.

A plurality of fifth partition members 35 are attached to the second surface 15B of the main substrate 15 (see FIG. 8). The main substrate 15 is provided with a space to set up the fifth partition members 35, and small second circuit components 20 are mounted to positions which are displaced from the space. The fifth partition members 35 include a first block 35A which has a smaller length, and a second block 35B which has a larger length. The second ventilation space 43 is provided in a position which is between the first block 35A and the second block 35B. Each of the fifth partition members 35 is formed of a sponge which has a bar shape and a square cross section.

The function of cooling the circuit component 17 of the television 11 according to the first embodiment will be explained with reference to FIG. 2 and FIG. 3.

Heat which is generated from the first circuit component 17 that is located on the first surface 15A of the main substrate 15 is conveyed from one end part 21A to the other end part 21B by the heat pipe 21. The heat which has been conveyed to the other end part 21B of the heat pipe 21 is conveyed to the fin unit 23. In this state, the heat is conveyed to the wind (air) which passes through the first ventilation space 42, and the heat is discharged to the outside of the housing 12 through the discharge part 37 (see FIG. 7).

The first circuit component 17 is also cooled directly by the cooling air from the fan unit 18. Specifically, the cooling air which is guided by the exhaust part 52 (part which projects toward the circuit component 17) of the fan unit 18 is supplied to the circuit component 17 and removes heat from the circuit component 17, without being diffused to the surroundings. The air which has been applied to the circuit component 17 is conveyed toward the fin unit 23, further removes heat from the fin unit 23, and is discharged to the outside of the housing 12 through the discharge part 37. The cooling air from the fan unit 18 is guided by the first partition members 31 to the vicinity of the discharge part 37 (fin unit 23), and thus does not leak from the first ventilation space 42 to the other parts in the housing 12. Thereby, the first circuit component 17 is smoothly cooled.

In the same manner, the second circuit components 20 that are located on the second surface 15B of the main substrate 15 are directly cooled by the cooling air from the fan unit 18. The air which has been applied to the second circuit components 20 is conveyed toward the fin unit 23, further removes heat from the fin unit 23, and is discharged to the outside of the housing 12 through the discharge part 37 (see FIG. 8). The cooling air from the fan unit 18 is guided by the second partition member 32 to the vicinity of the discharge part 37 (fin unit 23), and thus does not leak from the second ventilation space 43 to the other parts in the housing 12. Thereby, the second circuit components 20 are smoothly cooled.

According to the first embodiment, the television 11 comprises the housing 12, the printed circuit board which includes the first surface 15A that is provided with the heat-generating component and the second surface 15B that is opposed to the first surface 15A and is contained inside the housing 12, and the fan unit 18 which includes the case 45 and the fan 46 that is rotatably contained in the case 45, the case 45 including the discharge part 52 which includes the first wall part 53A that overlaps the first surface 15A of the printed circuit board and extends toward the heat-generating component to run along the printed circuit board, and the second wall part 53B that extends from the first wall part 53A toward the printed circuit board, and the air intake part 51.

According to the above structure, since the television 11 is provided with the first wall part 53A and the second wall part 53B, the air from the fan 46 can more efficiently be applied to the heat-generating component. Thereby, the cooling efficiency for the heat-generating component can be improved. In addition, since the cooling efficiency equal to that of the fan unit 18 of the prior art can be obtained with a smaller number of rotations per minute, the rotations per minute of the fan 46 can be set to a smaller value, and thereby noise which is caused by rotation of the fan 46 can be reduced. Further, when the television 11 is assembled, the fan unit 18 can be attached to the housing 12 from the side of the first surface 15A such that the first wall part 53A and the second wall part 53B are superposed on the printed circuit board, after the printed circuit board (main substrate 15) is fixed to the housing 12. Therefore, the degree of freedom in assembly can be improved, the working property can be improved, and it is possible to flexibly cope with changes in design, in comparison with the fan unit 18 which is attached to the printed circuit board in advance and then fixed to the housing 12.

The first wall part 53A and the second wall part 53B form a tube shape together with the printed circuit board. According to the structure, the air from the fan 46 can more efficiently be applied to the heat-generating component. Thereby, the cooling efficiency for the heat-generating component can be improved, the rotations per minute of the fan 46 can be reduced and the noise of the fan unit 18 can be reduced.

The television 11 includes the discharge part 37 which the housing 12 is provided with, and the first partition members 31 which communicate with the exhaust part 52 and the discharge part 37 in a position between the housing 12 and the first surface 15A, and is attached to the printed circuit board and abuts against the housing 12 to partition the first ventilation space 42, in which the heat-generating component is disposed, from the other spaces in the housing 12. According to the structure, the first partition members 31 can prevent the air from the fan 46 from being diffused to the surroundings. Therefore, the cooling efficiency for the heat-generating component can be further improved, the rotations per minute of the fan 46 can be reduced, and the noise is reduced.

The television 11 includes a partition part 41 which is provided as one unitary piece with the housing 12 to partition the first ventilation space 42 from the other spaces inside the housing 12. According to the structure, the first ventilation space 42 is defined not only by the first partition members 31 but also by the partition part 41 which is provided as one unitary piece with the housing 12. Therefore, the first ventilation space 42 can be set according to circumstances, in accordance with the shape of the actual product (in particular, in the case where the housing 12 is unavoidably provided with projections such as bosses).

The second wall part 53B connects with the first partition members 31. According to the structure, the air from the fan 46 does not leak from a space between the second wall part 53B and the first partition members 31, and the cooling efficiency for the heat-generating component can be further improved.

The television 11 includes the opening part 36 with which the housing 12 is provided, and the second partition member 32 which is attached to the case 45 and abuts against the housing 12 to partition the air intake space 44 that communicates with the opening part 36 and the air intake part 51 from the other spaces inside the housing 12. According to the structure, for example, the air which has been heated in the housing 12 is prevented from being taken into the air intake part 51 of the fan unit 18, and the cool air which exists outside the housing 12 can mainly be taken into the fan unit 18. Thereby, the cooling efficiency for the heat-generating component can be improved, and the noise of the fan unit 18 can be reduced.

The television 11 includes the third partition member 33 which is attached to the housing 12 and abuts against the case 45 to partition the air intake space 44 from the other spaces inside the housing 12. According to the structure, the third partition member 33 and the second partition member 32 prevent the air which has been heated in the housing 12 from being taken into the air intake part 51 of the fan unit 18, and the cool air which exists outside the housing 12 can mainly be taken into the fan unit 18. Thereby, the cooling efficiency for the heat-generating component can be improved, and the noise of the fan unit 18 can be reduced. In addition, the third partition member 33 can be adhered to the housing 12 in advance when the housing 12 is shipped (manufactured), and the work quantity in the assembly line can be reduced.

The television 11 includes the fourth partition member 34 which is attached to the housing 12 and abuts against the printed circuit board to partition the air intake space 44 from the other spaces inside the housing 12. According to the structure, the fourth partition member 34 as well as the second and third partition members 32 and 33 prevent the air which has been heated in the housing 12 from being taken into the air intake part 51 of the fan unit 18. Thereby, the cooling efficiency for the heat-generating component can be improved, and the noise of the fan unit 18 can be reduced.

The television 11 includes fifth partition members 35 which are attached to the printed circuit board and abut against the housing 12 to partition the second ventilation space 43, which communicates with the exhaust part 52 and the discharge part 37 in a position between the housing 12 and the second surface 15B and in which the second heat-generating components are arranged, from the other spaces inside the housing 12. According to the structure, the cooling efficiency for the heat-generating component can be improved, and it is possible to prevent heat from filling the inside of the housing 12.

Next, a second embodiment of the electronic apparatus will be explained hereinafter, with reference to FIG. 4 to FIG. 9. A portable computer 61 which is an example of the electronic apparatus of the second embodiment is different in external appearance from the first embodiment, but is generally similar to the first embodiment in the other parts. Therefore, parts of the second embodiment which are different from the first embodiment will be mainly explained. Parts which are common to the first and second embodiments will be denoted by respective common reference numerals, and explanation thereof is omitted.

As illustrated in FIG. 4, the portable computer 61 comprises a main body part 62, a display part 63 which can cover the main body part 62 from above and stand with respect to the main body part 62, and hinge parts 64 which are provided between the main body part 62 and the display part 63 and make the display part 63 rotatable with respect to the main body part 62.

As illustrated in FIG. 4, the display part 63 includes a display panel 14, a display cabinet 65 which covers the display panel 14, and a camera 66 which is provided in a position of the display cabinet 65 that is distant from the main body part 62. Although the display panel 14 is formed of a liquid crystal display panel having a rectangular plate shape, the display panel 14 may be a display panel of another type, such as a plasma display panel, an organic EL, a plastic display panel, and a sheet display panel.

The main body part 62 includes, for example, a main body cabinet 67 which forms an outer shell, and a keyboard 68 and a touch pad 69 which are attached to the main body cabinet 67. A printed circuit board controls the whole portable computer 61. The display cabinet 65 and the main body cabinet 67 form the housing 12.

Figure 5:
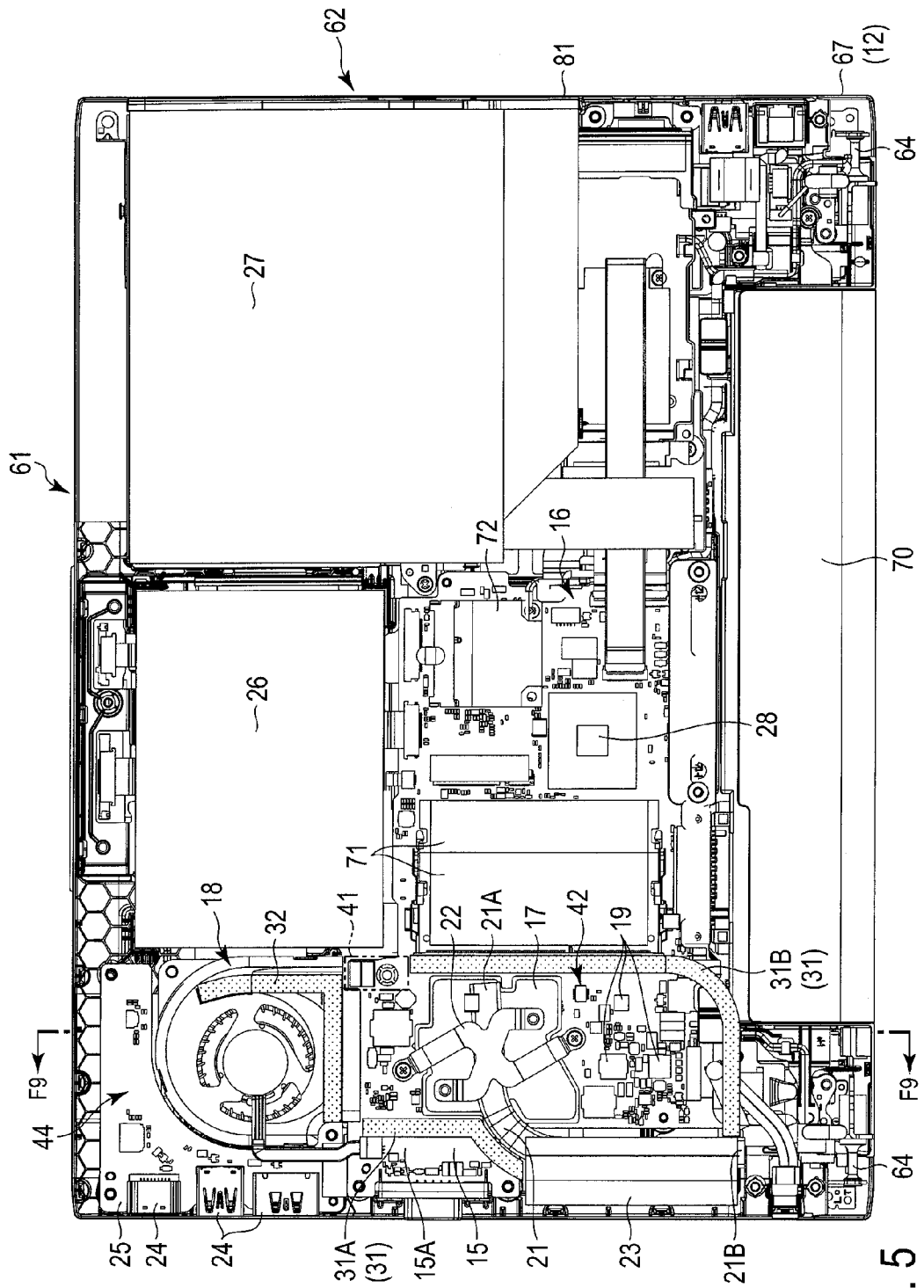
FIG. 5 is an exemplary bottom view of an inside of a main body part of the portable computer illustrated in FIG. 4, which is in a state where a second case is detached.

As illustrated in FIG. 5, the main body part 62 includes, inside the main body cabinet 67, a main substrate 15 (printed circuit board, printed board, controller, motherboard) which controls components of the portable computer 61, a tuner module 16 which is formed in a part of the main substrate 15, a first circuit component 17 (heat-generating component, CPU) which is provided on the main substrate 15, a fan unit 18 configured to cool the circuit component 17 and the like, a heat pipe 21 which is thermally connected at one end part 21A to the circuit component 17 and conveys heat from the circuit component 17, a holder 22 (fixing tool) 22 configured to fix the heat pipe 21 to the circuit component 17, a fin unit 23 which is provided at the other end part 21B of the heat pipe 21 and includes a plurality of heat-radiating fins, power supply circuit components 19 (heat-generating component) which are provided on the main substrate 15, a connector substrate 25 (printed circuit board) which is provided with a connector 24 for external connection, a hard disk drive 26, an optical disk drive 27, a speaker, first to fifth partition members 31 to 35, and a battery 70 which supplies electric power to the main substrate 15. The main substrate 15 is electrically connected to each of the connector substrate 25, the hard disk drive 26, the optical disk drive 27, and the speaker, through cables or flexible cables. The holder 22 includes a fixing metal plate and fixing members such as screws.

As illustrated in FIG. 7, the main body cabinet 67 (housing 12) includes an air-intake opening part 36 configured to take the external air into the housing 12, and a discharge part 37 configured to discharge the air which has been heated by the heat-generating component to the outside of the housing 12. As illustrated in FIG. 4, the main body cabinet 67 (housing 12) includes a first case 81, to which the keyboard 68 is attached, and a second case 82 which is opposed to the first case 81 and abuts against the first case 81.

Figure 6:
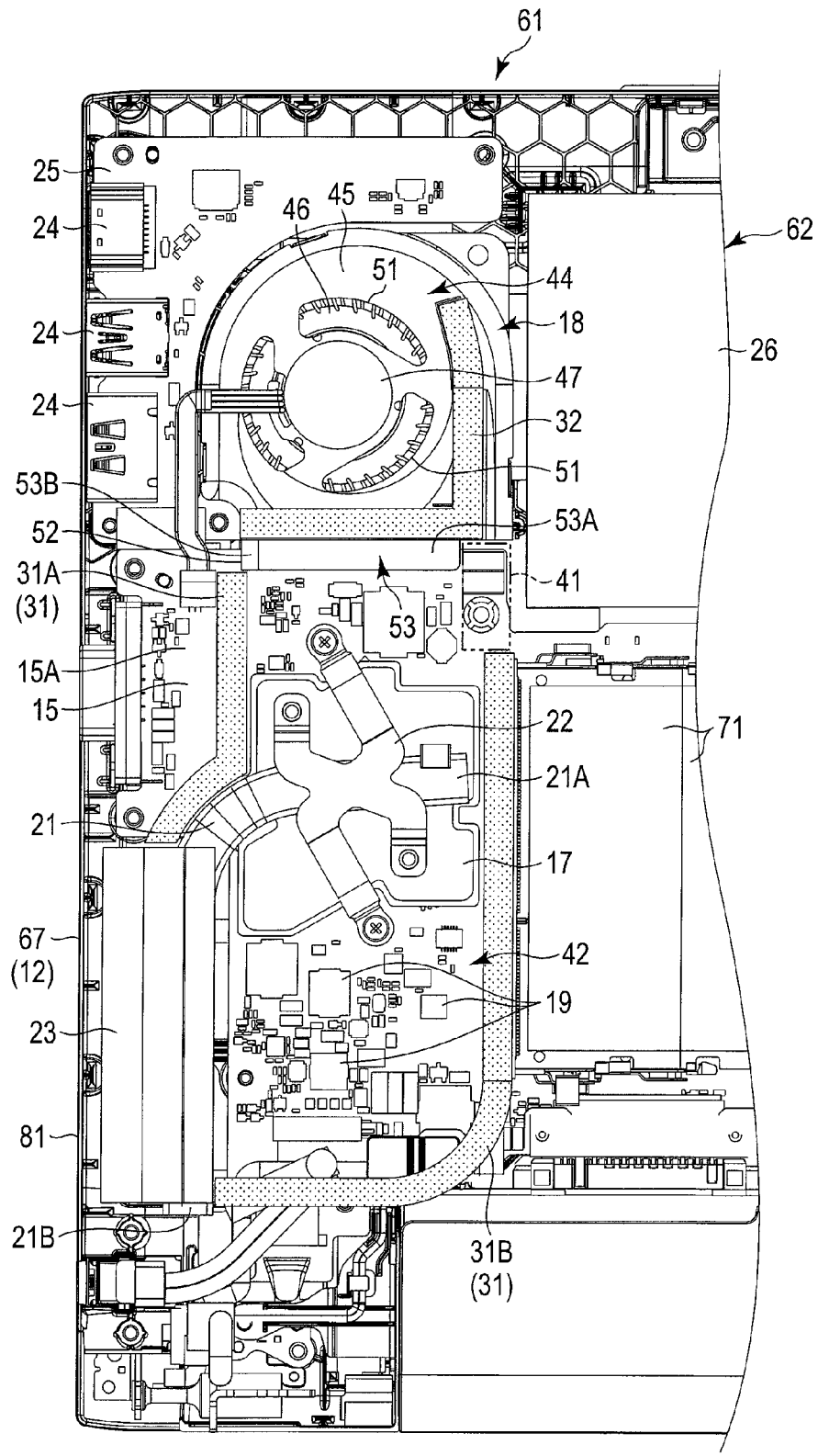
FIG. 6 is an exemplary enlarged bottom view of the inside of the main body part illustrated in FIG. 5.

As illustrated in FIG. 6 to FIG. 8, the main body part 62 (portable computer 61) includes a partition part 41 which is formed as one unitary piece with the main body cabinet 67 (housing 12), a first ventilation space 42 which is located between the main body cabinet 67 and the first surface 15A and communicates with an exhaust part 52 and the discharge part 37, a second ventilation space 43 which is located between the main body cabinet 67 and the second surface 15B and communicates with the exhaust part 52 and the discharge part 37, and an air intake space 44 which communicates with the opening part 36 and an air intake part 51. The partition part 41 is, for example, a boss which is provided on the main body cabinet 67 to fix the fixing members such as screws, and projects from the other parts of the main body cabinet 67 (housing 12).

The main substrate 15 includes the first surface 15A, and the second surface 15B which is opposed to the first surface 15A (see FIG. 3). As illustrated in FIG. 5, the first surface 15A of the main substrate 15 is provided with the first circuit component 17 (heat-generating component, CPU), a third circuit component 28 (graphics controller), an SSD 71, (solid state drive), and a wireless LAN module 72. As illustrated in FIG. 8, the second surface 15B of the main substrate 15 is provided with a plurality of second circuit components 20 (second heat-generating component), which are smaller than the first circuit component 17.

The structure of the fan unit 18 is the same as the first embodiment. As illustrated in FIG. 6, the fan unit 18 includes a case 45 (fan case) which has an almost box shape, a fan 46 which is rotatably contained in the case 45, and a motor 47 which rotates the fan 46. The case 45 includes the air intake part 51 for air intake, and the exhaust part 52 which exhausts the air which is fanned by the fan 46. The exhaust part 52 includes a projecting part 53 which projects toward the circuit component 17 (heat-generating component) (see FIG. 3). The projecting part 53 which projects toward the circuit component 17 includes a first wall part 53A which overlaps the first surface 15A of the main substrate 15 (printed circuit board) and extends toward the circuit component along the main substrate 15, and a second wall part 53B which extends from one end part (one end part in a direction perpendicular to a direction approaching the circuit component 17 (heat-generating component) from the fan 46) of the first wall part 53A toward the main substrate 15 (printed circuit board).

The second wall part 53B is formed on only one end part of the first wall part 53A. The second wall part 53B is provided to connect with the first partition members 31, in the state where the fan unit 18 is attached to the housing 12. Although a space 54 (clearance), which is determined in consideration of various tolerances (such as a tolerance of the main substrate 15, tolerance of the fan unit 18, and tolerance of the housing 12), is provided between the end part of the second wall part 53B and the main substrate 15, the end part of the second wall part 53B is located in the vicinity of the main substrate 15.

In addition, the partition part 41 is disposed in the vicinity of the other end part, which is located opposite to the one end part of the first wall part 53A, of the first wall part 53A, such that the air current from the fan 46 is guided by the partition part 41 to the discharge part 37 (see FIG. 3 and FIG. 6). Specifically, in the present embodiment, the first surface 15A of the main substrate 15, the first wall part 53A, the second wall part 53B, and the partition part 41 form a pipe-like (or duct-like) structure to guide the air current from the fan 46 toward the circuit component 17.

As illustrated in FIG. 6, a plurality of first partition members 31 are attached to the first surface 15A of the main substrate 15. The main substrate 15 is provided with a space to set up (mount) the first partition members 31, and the circuit component 17 and the power supply circuit components 19 are mounted to positions which are displaced from the space. The first partition members 31 include a first part 31A which has a smaller length, and a second part 31B which has a larger length. The first circuit component 17 and the power supply circuit components 19 are provided in positions which are between the first part 31A and the second part 31B. Each of the first partition members 31 is formed of a sponge which has a bar shape and a square cross section.

The first ventilation space 42 is provided in a position which is between the first part 31A and the second part 31B. The perimeter of the first ventilation space 42 is defined by the first part 31A, the second part 31B, the partition part 41, the first surface 15A of the main substrate 15, and the internal surface of the housing 12. In other words, the first circuit component 17 and the power supply circuit components 19 are arranged in the first ventilation space 42.

As illustrated in FIG. 6, the second partition member 32 is attached to the case 45, which will be explained later, of the fan unit 18. The second partition member 32 is formed of a sponge which has a bar shape and a square cross section. The second partition member 32 has an almost "L" shape, and is provided in the vicinity of the air intake part 51 of the case 45 to surround the air intake part 51.

As illustrated in FIG. 7, the third partition member 33 is attached to the second case 82 of the housing 12, and abuts against and spreads over both the case 45 of the fan unit 18 and the connector substrate 25 in a state where the portable computer 61 is assembled. The third partition member 33 is formed of a sponge which has a bar shape and a square cross section. The third partition member 33 is provided in the vicinity of the opening part 36 to surround the opening part 36.

As illustrated in FIG. 7, the fourth partition member 34 is attached to the second case 82 of the housing 12, and abuts against the connector substrate 25 in a state where the portable computer 61 is assembled. The fourth partition member 34 is formed of a sponge which has a bar shape and a square cross section. The fourth partition member 34 is provided in the vicinity of the opening part 36 to surround the opening part 36. The air intake space 44 is provided in a position which is surrounded by the second to fourth partition members 32 to 34 that form an almost "U" shape.

As illustrated in FIG. 8, a plurality of fifth partition members 35 are attached to the second surface 15B of the main substrate 15. The main substrate 15 is provided with a space to set up the fifth partition members 35, and small second circuit components 20 are mounted to positions which are displaced from the space. The fifth partition members 35 include a first block 35A which has a smaller length, and a second block 35B which has a larger length. The second ventilation space 43 is provided in a position which is between the first block 35A and the second block 35B. Each of the fifth partition members 35 is formed of a sponge which has a bar shape and a square cross section.

The function of cooling the circuit component 17 of the portable computer 61 according to the second embodiment will be explained with reference to FIG. 5, FIG. 6, FIG. 8, and FIG. 9.

Heat which is generated from the first circuit component 17 that is located on the first surface 15A of the main substrate 15 is conveyed from one end part 21A to the other end part 21B by the heat pipe 21. The heat which has been conveyed to the other end part 21B of the heat pipe 21 is conveyed to the fin unit 23. In this state, the heat is conveyed to the wind (air) which passes through the first ventilation space 42, and the heat is discharged to the outside of the housing 12 through the discharge part 37.

The first circuit component 17 is also cooled directly by the cooling air from the fan unit 18. Specifically, the cooling air which is guided by the exhaust part 52 (projecting part 53 which projects toward the circuit component 17) of the fan unit 18 is supplied to the circuit component 17 and removes heat from the circuit component 17, without being diffused to the surroundings. The air which has been applied to the circuit component 17 is conveyed toward the fin unit 23, further removes heat from the fin unit 23, and is discharged to the outside of the housing 12 through the discharge part 37. The cooling air from the fan unit 18 is guided by the first partition members 31 to the vicinity of the discharge part 37 (fin unit 23), and thus does not leak from the first ventilation space 42 to the other parts in the housing 12. Thereby, the first circuit component 17 is smoothly cooled.

In the same manner, the second circuit components 20 that are located on the second surface 15B of the main substrate 15 are directly cooled by the cooling air from the fan unit 18. The air which has been applied to the second circuit components 20 is conveyed toward the fin unit 23, further removes heat from the fin unit 23, and is discharged to the outside of the housing 12 through the discharge part 37. The cooling air from the fan unit 18 is guided by the second partition member 32 to the vicinity of the discharge part 37 (fin unit 23), and thus does not leak from the second ventilation space 43 to the other parts in the housing 12. Thereby, the second circuit components 20 are smoothly cooled.

According to the second embodiment, the portable computer 61 comprises the housing 12, the printed circuit board which includes the first surface 15A that is provided with the heat-generating component and is contained inside the housing 12, and the fan unit 18 which includes the case 45 and the fan 46 that is rotatably contained in the case 45, the case 45 including the discharge part 52 which includes the part that overlaps the first surface 15A of the printed circuit board and projects toward the heat-generating component, and the air intake part 51.

According to the above structure, since the portable computer 61 is provided with the first wall part 53A and the second wall part 53B, the air from the fan 46 can more efficiently be applied to the heat-generating component. Thereby, the cooling efficiency for the heat-generating component can be improved. In addition, since the cooling efficiency equal to that of the fan unit 18 of the prior art can be obtained with a smaller number of rotations per minute, the rotations per minute of the fan 46 can be set to a smaller value, and thereby noise which is caused by rotation of the fan 46 can be reduced. Further, when the portable computer 61 is assembled, the fan unit 18 can be attached to the housing 12 from the side of the first surface 15A such that the first wall part 53A and the second wall part 53B are superposed on the printed circuit board, after the printed circuit board is fixed to the housing 12. Therefore, the degree of freedom in assembly can be improved, the working property can be improved, and it is possible to flexibly cope with changes in design, in comparison with the fan unit 18 which is attached to the printed circuit board in advance.

Next, a third embodiment of the electronic apparatus will be explained hereinafter with reference to FIG. 10. A portable computer 61 which is an example of the electronic apparatus according to the third embodiment is different from the second embodiment in structure of the fan unit 18, but is generally similar to the second embodiment in the other parts. Therefore, the parts of the third embodiment which are different from the second embodiment will be mainly explained, and parts which are common to the third embodiment and the second embodiment are denoted by respective common reference numerals, and will not be explained hereinafter.

A fan unit 18 includes a case 45 (fan case) which has an almost box shape, a fan 46 which is rotatably contained in the case 45, and a motor 47 which rotates the fan 46. The case 45 includes an air intake part 51 for air intake, and an exhaust part 52 which exhausts the air which is fanned by the fan 46. The exhaust part 52 includes a projecting part 53 which projects toward a circuit component 17 (heat-generating component). The projecting part 53 which projects toward the circuit component 17 includes a first wall part 53A which overlaps a first surface 15A of a main substrate 15 (printed circuit board) and extends toward the circuit component 17 along the main substrate 15, and second wall parts 53B which extend from both end parts (both end parts in a direction perpendicular to a direction approaching the circuit component 17 (heat-generating component) from the fan 46) of the first wall part 53A toward the main substrate 15 (printed circuit board). In the present embodiment, a pair of second wall parts 53B are formed on the end parts of the first wall part 53A.

Although a space 54 (clearance), which is determined in consideration of various tolerances (such as a tolerance of the main substrate 15, tolerance of the fan unit 18, and tolerance of a housing 12), is provided between the end part of each second wall part 53B and the main substrate 15, the end part of each second wall part 53B is located in the vicinity of the main substrate 15. Each second wall part 53B is provided to connect with first partition members 31 in a state where the fan unit 18 is attached to the housing 12.

In the present embodiment, the first surface 15A of the main substrate 15, the first wall part 53A, and the second wall part 53B form a pipe-like (or duct-like) structure to guide the air current from the fan 46 toward the circuit component 17.

A plurality of first partition members 31 are attached to the first surface 15A of the main substrate 15. The main substrate 15 is provided with a space to set up (mount) the first partition members 31, and the circuit component 17 and power supply circuit components 19 are mounted to positions which are displaced from the space. The first partition members 31 include a first part 31A which has a smaller length, and a second part 31B which has a larger length. The first circuit component 17 is provided in a position which is between the first part 31A and the second part 31B. Each of the first partition members 31 is formed of a sponge which has a bar shape and a square cross section.

A first ventilation space 42 is provided in a position which is between the first part 31A and the second part 31B. The perimeter of the first ventilation space 42 is defined by the first part 31A, the second part 31B, a partition part 41, the first surface 15A of the main substrate 15, and the internal surface of a main body cabinet 67 (housing 12).

A function of cooling the circuit component 17 of the portable computer 61 according to the third embodiment will be explained hereinafter with reference to FIG. 10.

Heat which is generated from the first circuit component 17 that is located on the first surface 15A of the main substrate 15 is conveyed from one end part 21A to the other end part 21B by the heat pipe 21. The heat which has been conveyed to the other end part 21B of the heat pipe 21 is conveyed to the fin unit 23. In this state, the heat is conveyed to the wind (air) which passes through the first ventilation space 42, and the heat is discharged to the outside of the housing 12 through a discharge part 37.

The first circuit component 17 is also cooled directly by the cooling air from the fan unit 18. Specifically, the cooling air which is guided by the exhaust part 52 (projecting part 53 which projects toward the circuit component 17) of the fan unit 18 is supplied to the circuit component 17 and removes heat from the circuit component 17, without being diffused to the surroundings. The air which has been applied to the circuit component 17 is conveyed toward the fin unit 23, further removes heat from the fin unit 23, and is discharged to the outside of the housing 12 through the discharge part 37. The cooling air from the fan unit 18 is guided by the first partition members 31 (first part 31A and second part 31B) to the vicinity of the discharge part 37, and thus does not leak from the first ventilation space 42 to the other parts in the housing 12. Thereby, the first circuit component 17 is smoothly cooled.

According to the third embodiment, the projecting part 53 of the fan unit 18, which projects toward the circuit component 17, includes the first wall part 53A which overlaps the first surface 15A of the printed circuit board and extends toward the heat-generating component along the printed circuit board, and second wall parts 53B which extend from both end parts (both end parts in a direction perpendicular to a direction of going toward the heat-generating component from the fan 46) of the first wall part 53A toward the printed circuit board.

The above structure more effectively prevents the air which is discharged from the fan unit 18 from missing the heat-generating component, and the cooling efficiency for the heat-generating component can be further improved.

The electronic apparatus is not limited to the television 11 and the portable computer 61 disclosed in the above embodiments, and is applicable to other electronic apparatuses such as a mobile phone as a matter of course. In addition, the electronic apparatus is not limited to the above embodiments without any change, and can be carried out by modifying the constituent elements within a range not departing from the gist. Specifically, although the electronic apparatus is realized with a plurality of (at least two) first partition members 31 in the above embodiments, the electronic apparatus may be realized with one first partition member or at least three first partition members. In the same manner, although the electronic apparatus is realized with a plurality of (at least two) fifth partition members 35 in the above embodiments, the electronic apparatus may be realized with one fifth partition member or at least three fifth partition members. Further, although the first partition members 31 and the fifth partition members 35 are attached to the main substrate 15 in the above embodiments, the first partition members 31 and the fifth partition members 35 may be attached to the internal surfaces of the housing 12 and be made to abut against the main substrate 15.

In addition, although the main substrate 15 and the connector substrate 25 are formed of separate printed circuit boards in the above embodiments, they may be formed of one printed circuit board. Although the first to fifth partition members 31 to 35 are formed of sponges, the material of the first to fifth partition members 31 to 35 is not limited to such, and may be any material as long as it can exhibit an elasticity similar to rubber (such as synthetic rubber, urethane foam, and styrene foam). The heat-generating components (circuit component) which are disposed in the first ventilation space 42 are not limited to the CPU or power supply circuit component 19, and any components may be disposed as long as they generate a large quantity of heat, such as the graphics controller 28 (graphics chip) and the SSD 71.

In the above embodiments, the main substrate 15 (printed circuit board) is disposed in a middle part in the height direction of the fan unit 18, such that the air current quantity on the side of the first surface 15A is almost equal to the air current quantity on the side of the second surface 15B. To efficiently cool the circuit component 17, however, the fan unit 18 may be disposed closer to the first surface 15A (the exhaust part 52 is disposed to be opened to the first surface 15A with a larger opening than an opening for the second surface 15B), to set the air current quantity on the side of the first surface 15A larger than the air current quantity on the side of the second surface 15B.

In addition, various inventions can be made by proper combinations of constituent elements which are disclosed in each of the above embodiments. For example, some constituent elements may be deleted from all the constituent elements disclosed in the embodiment. Further, constituent elements of different embodiments may be used in combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing comprising a printed circuit board which comprises a first surface comprising a first heat-generating component and a second surface that is opposed to the first surface;
a fan unit which comprises a case and a fan that is rotatably contained in the case, the case comprising an air intake part and an exhaust part configured to exhaust air directly on the first surface along the printed circuit board; and
first partition members which define a first ventilation space between the first surface and an internal surface of the housing, the first partition members configured to guide the air through the first ventilation space toward the first heat-generating component, wherein
the second surface comprises a second heat-generating component;
the exhaust part is configured to exhaust air directly on the second surface along the printed circuit board; and
the electronic apparatus further comprises a fifth partition member which defines a second ventilation space between the second surface and the internal surface of the housing the fifth partition member configured to guide the air through the second ventilation space toward the second heat-generating component.

2. The electronic apparatus of claim 1, wherein
the first partition members comprise a first wall part and a second wall part which overhang an edge of the first surface toward the first heat-generating component, the first wall part and the second wall part form a duct-like structure together with the printed circuit board.

3. The electronic apparatus of claim 1, wherein
the housing further comprises a discharge part provided farther from the exhaust part (52) than the first heat-generating component; and
the first partition member extends between the exhaust part and the discharge part and is configured to partition the first ventilation space where the first heat-generating component is arranged in, from other spaces in the housing.

4. The electronic apparatus of claim 1, wherein
the housing further comprises a partition part as unitary portion to partition the first ventilation space from the other spaces in the housing.

5. The electronic apparatus of claim 2, wherein
the second wall part connects with the first partition member.

6. The electronic apparatus of claim 1, wherein
the housing further comprises an opening part configured to take an external air into the housing; and
the electronic apparatus further comprises a second partition member which is placed in the vicinity of the air intake part, the second partition member (which defines an air intake space between the case and an internal surface of the housing to guide the air from the opening part to the air intake part through the air intake space.

7. The electronic apparatus of claim 6, further comprising:
a third partition member which is attached to the internal surface of the housing and abuts against the case to partition the air intake space from the other spaces in the housing.

8. The electronic apparatus of claim 6, further comprising:
a fourth partition member which is attached to the internal surface of the housing and abuts against the printed circuit board to partition the air intake space from the other spaces in the housing.

9. An electronic apparatus comprising:
a housing comprising a printed circuit board and a discharge part, the printed circuit board which comprises a first surface comprising a first heat-generating component, and a second surface opposed to the first surface and comprising a second heat-generating component;
a fan unit which comprises a case and a fan that is rotatably contained in the case, the case comprising an air intake part and an exhaust part, the fan unit configured to exhaust air both to the first surface and to the second surface;
a first partition member configured to define a first ventilation space between the internal surface of the housing and the first surface, to partition the first ventilation space from other spaces in the housing, and to guide the air through the first ventilation space from the exhaust part to the discharge part via the first heat-generating component on the first surface; and
a fifth partition member configured to define a second ventilation space between the internal surface of the housing and the second surface, to partition the second ventilation space from other spaces in the housing, and to guide the air through the second ventilation space from the exhaust part to the discharge part via the second heat-generating component on the second surface.

10. An electronic apparatus comprising:
a housing comprising a printed circuit board which comprises a first surface on which a heat-generating component is mounted and a second surface that is opposed to the first surface, and a discharge part; and
a fan unit which comprises a case and a fan that is rotatably contained in the case, the case comprising an exhaust part configured to exhaust air both to the first surface for applying the air to the heat-generating component and to the second surface, along the printed circuit board;
a first partition member configured to define a first ventilation space extending from the exhaust part to the discharge part between an internal surface of the housing and the first surface; and
a second partition member configured to define a second ventilation space extending from the exhaust part to the discharge part between an internal surface of the housing and the second surface.

11. The electronic apparatus of claim 1, wherein the first partition member is made of sponge.

12. The electronic apparatus of claim 1, wherein the first heat-generating component is disposed in downstream of the air flow exhausted from the exhaust part.

* * * * *